United States Patent
Davis, Jr. et al.

(10) Patent No.: US 9,591,795 B2
(45) Date of Patent: Mar. 7, 2017

(54) SENSOR-BASED REMOVAL OF A SOLDERED DEVICE

(71) Applicant: LENOVO ENTERPRISE SOLUTIONS (SINGAPORE) PTE. LTD., New Tech Park (SG)

(72) Inventors: Willie Theodore Davis, Jr., Raleigh, NC (US); Michk Huang, Taipei (TW); Matthew Stephen Kelly, Ontario (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 385 days.

(21) Appl. No.: 14/489,623

(22) Filed: Sep. 18, 2014

(65) Prior Publication Data

US 2016/0088780 A1  Mar. 24, 2016

(51) Int. Cl.
H05K 13/04 (2006.01)
G05B 19/4155 (2006.01)
G05B 19/402 (2006.01)
B23K 1/018 (2006.01)

(52) U.S. Cl.
CPC ......... *H05K 13/0486* (2013.01); *B23K 1/018* (2013.01); *G05B 19/402* (2013.01); *G05B 19/4155* (2013.01); *G05B 2219/45235* (2013.01)

(58) Field of Classification Search
CPC ............. G05B 19/402; G05B 19/4155; G05B 2219/45235; H05K 13/0486; B23K 1/018
USPC ................... 73/781, 827, 856, 859
See application file for complete search history.

(56) References Cited

U.S. PATENT DOCUMENTS

| | | | |
|---|---|---|---|
| 3,735,911 A | | 5/1973 | Ward |
| 3,842,478 A | * | 10/1974 | Schreckeneder ...... B23K 1/018 228/20.5 |
| 4,022,370 A | | 5/1977 | Durney |
| 4,160,893 A | | 7/1979 | Meyen et al. |
| 4,278,867 A | | 7/1981 | Tan |
| 4,366,925 A | | 1/1983 | Fanene |

(Continued)

FOREIGN PATENT DOCUMENTS

| | | |
|---|---|---|
| GB | 2241459 | 12/1993 |
| JP | 2010205957 A * | 9/2010 |

OTHER PUBLICATIONS

"Interposer Remove Tool." NA920925. IBM Technical Disclosure Bulletin, US, Sep. 1992.*

(Continued)

*Primary Examiner* — Lisa Caputo
*Assistant Examiner* — Punam Roy
(74) *Attorney, Agent, or Firm* — Katherine Brown (57) ABSTRACT

An apparatus includes at least one grip mechanism of a rework nozzle configured to grip an electrical component that is soldered to a printed circuit board. The apparatus includes at least one spring coupled to at least one grip mechanism, where the spring is configured to move beyond a minimum threshold in response to an initiation of a melt of a solder that attaches the electrical component to the printed circuit board. The apparatus includes at least one sensor coupled to at least one spring, where the sensor is configured to detect the move of at least one spring beyond the minimum threshold. At least one sensor is configured to communicate at least one activate signal in response to detection of the move of one or more springs beyond the minimum threshold.

20 Claims, 7 Drawing Sheets

(56) References Cited

U.S. PATENT DOCUMENTS

| | | | |
|---|---|---|---|
| 4,521,959 A * | 6/1985 | Sprenkle | H05K 13/0491 29/741 |
| 4,561,584 A | 12/1985 | Hug | |
| 4,561,586 A * | 12/1985 | Abel | H05K 13/0486 228/119 |
| 4,659,004 A * | 4/1987 | Fridman | B23K 1/012 228/49.1 |
| 4,752,025 A * | 6/1988 | Stach | H05K 13/0486 228/191 |
| 4,923,521 A * | 5/1990 | Liu | B23K 1/018 134/5 |
| 5,065,933 A | 11/1991 | Basavanhally | |
| 5,523,642 A * | 6/1996 | Hashimoto | G01L 1/16 310/319 |
| 5,560,100 A * | 10/1996 | Englert | B23K 1/018 29/712 |
| 5,605,277 A | 2/1997 | Jackson et al. | |
| 5,779,133 A | 7/1998 | Jackson et al. | |
| 6,156,150 A * | 12/2000 | Nishida | H05K 13/0486 156/701 |
| 6,360,934 B1 | 3/2002 | Cilia et al. | |
| 6,607,113 B2 | 8/2003 | Cilia et al. | |
| 6,811,072 B2 | 11/2004 | Bolde | |
| 6,906,924 B2 | 6/2005 | Luebs | |
| 7,296,727 B2 * | 11/2007 | Onobori | B23K 1/0016 228/102 |
| 7,469,457 B2 * | 12/2008 | Ishikawa | H05K 13/0491 228/119 |
| 7,472,818 B2 | 1/2009 | Chapman et al. | |
| 7,575,146 B2 | 8/2009 | Chapman et al. | |
| 9,338,935 B2 * | 5/2016 | Bessette | B23K 1/018 |
| 2002/0033409 A1 | 3/2002 | Cilia et al. | |
| 2004/0228089 A1 | 11/2004 | Luebs | |
| 2006/0054657 A1 * | 3/2006 | Francis | B23K 1/018 228/19 |

OTHER PUBLICATIONS

"Component Removal and Replacement Tool." NN9505301. IBM Technical Disclosure Bulletin, US, May 1995.*

"Surface-Mounted Component Desoldering Tool." NN86023946. IBM Technical Disclosure Bulletin, US, Feb. 1986.*

"Solder Fatigue Tester." NN73033217. IBM Technical Disclosure Bulletin, US, Mar. 1973.*

* cited by examiner

SENSOR-BASED REMOVAL OF A SOLDERED DEVICE

BACKGROUND

Embodiments of the present invention generally relate to the field of electronic devices, and, more particularly, to sensor-based removal of a soldered device.

Electronic devices typically include a printed circuit board (PCB) having a number of different components attached using solder or utilizing compliant pins. These soldered components can include AOPs (active, optics, and passive), connectors (including sockets), logic, memory, and power. Removal and replacement, commonly referred to as "rework," of some of these soldered components on a given PCB may need to occur due to solder defects, component defects, or design issues. Because the density of these components on a printed circuit board is continuing to increase, the removal and replacement of the component can be more difficult. This rework process of surface mount connectors can be particularly complicated in situations where the connector dimensions are much larger in the X or Y direction than the opening for hot air use to heat the solder to allow for removal of the component. Because the hot air generally is channeled across the span of the connector such that all the solder joints of the pins are reflowed without exceeding the temperature constraints of the connector housing, it is often difficult to develop a robust process that includes a custom nozzle and thermal reflow settings. The result can be a risk, during the rework removal process, of attempting to remove the connector in cases where the solder joints have not melted. After the unsuccessful attempt, the removal process has to be restarted.

One or more failed attempts at the rework process can damage the printed circuit board. For example, there can be a pad lift or barrel damage to the plated through holes from premature pulling of the component that is still partially attached to the printed circuit board. Also, a failed attempt can result in exposing the printed circuit board to an excessive number of heat cycles, which could result in catastrophic latent defects related to the printed circuit board.

SUMMARY

An apparatus includes at least one grip mechanism of a rework nozzle configured to grip an electrical component that is soldered to a printed circuit board. The apparatus includes at least one spring coupled to the at least one grip mechanism, wherein the at least one spring is configured to move beyond a minimum threshold in response to an initiation of a melt of a solder that attaches the electrical component to the printed circuit board. The apparatus includes at least one sensor coupled to the at least one spring, wherein the sensor is configured to detect the move of the at least one spring beyond the minimum threshold, wherein the at least one sensor is configured to communicate at least one activate signal in response to detection of the move of the at least one spring beyond the minimum threshold.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present invention. However, it is understood that the described embodiments may be practiced without these specific details. For instance, although examples refer to a components soldered to printed circuit boards, some embodiments can be incorporated for use in any other type of attach methods. In other instances, well-known instruction instances, protocols, structures and techniques have not been shown in detail in order not to obfuscate the description.

Some embodiments incorporate movable sensors to existing rework tools used in a rework process to remove of components soldered to PCBs. The movable sensors can eliminate premature component removal and reduce problems associated with PCB defects such as pad lift and plated through hole barrel damage that can be caused by improper removal of soldered components from PCBs. Some embodiments can be applied to different types of rework operations. For example, some embodiments can be applied to surface mounted technology hot gas operations, plated through hole solder fountain rework operations, etc.

Some embodiments include a spring that is equipped with a modified rework nozzle that can be part of a rework tool. The spring can supply a small amount of force to a part of the component that is to be de-soldered and removed from a PCB. One or more sensors can be triggered by movement of the spring that occurs as a result of melted solder. In turn, this triggering on the one or more sensors notifies the modified rework nozzle or operator thereof that the component can be safely removed or lifted from the PCB. For example, the one or more sensors can be communicatively coupled to a computer. In response to receiving notification of movement of the spring from the one or more sensors, the computer can activate the modified rework nozzle to lift the component from the PCB. Accordingly as further described below, some embodiments can ensure quality rework operations by preventing removal attempts in situations where solder joints are not melted. Therefore, some embodiments can prevent possible damage to a PCB that can result from pulling a component that is still partially attached to the PCB. Also, some embodiments can avoid exposing the PCB to an excessive number of heat cycles, which can result in catastrophic latent defects related to the PCB. Some embodiments can also enhance through-put issues in cases where multiple reworks occur.

Figure 1:
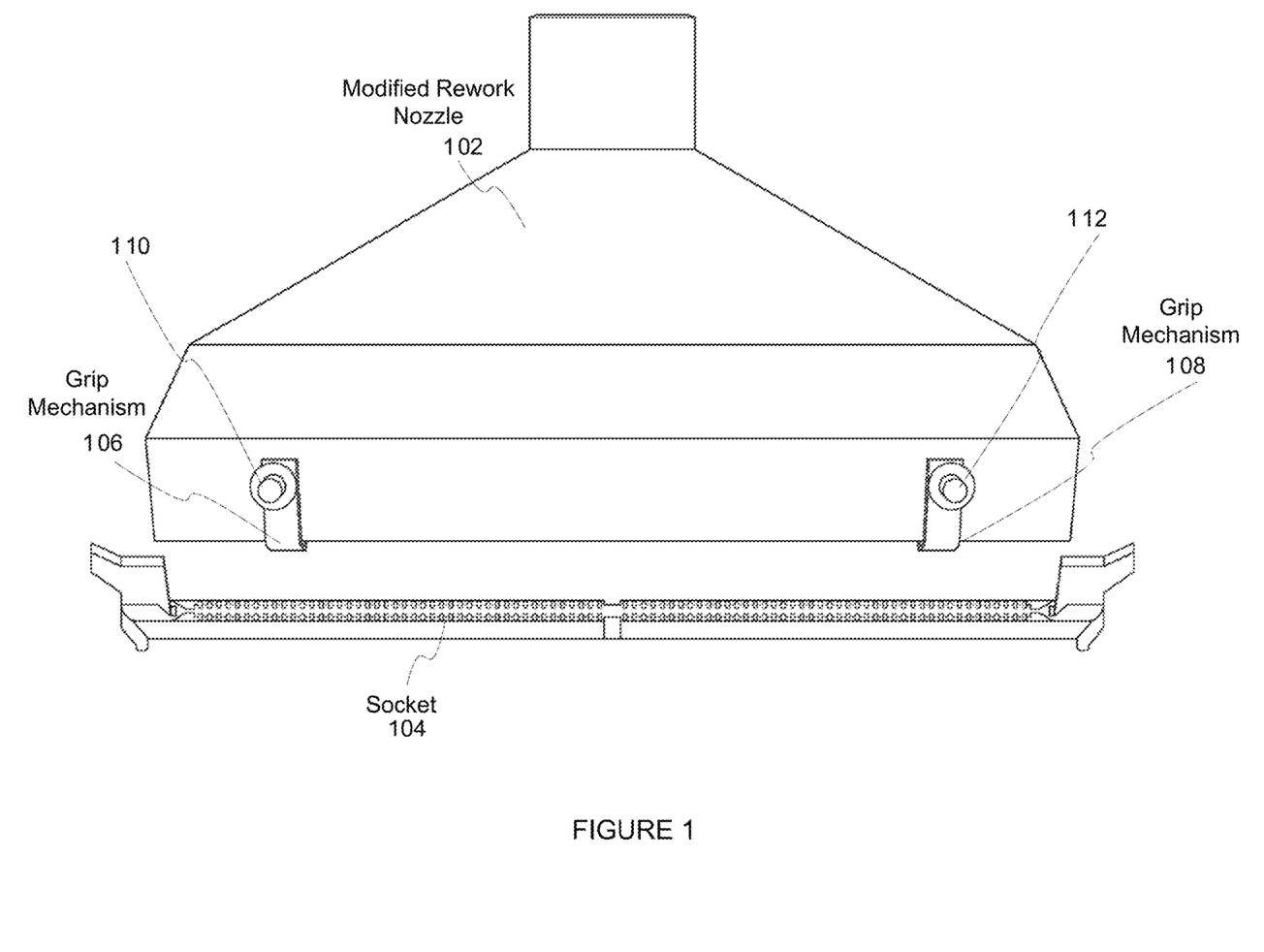
FIG. 1 depicts a side view of a nozzle of a modified rework nozzle that includes sensor-based removal of a soldered component, according to some embodiments.

FIG. 1 depicts a side view of a modified rework nozzle that includes sensor-based removal of a soldered component, according to some embodiments. In particular, FIG. 1 depicts a modified rework nozzle 102 that is positioned above a socket 104. The socket 104 can be part of a PCB for housing an electrical component that has been soldered onto the PCB. An electrical component can include any type of component, connector, socket, etc. that can be electrically coupled to the PCB. For example, the electrical component can be Dual In-Line Memory (DIMM). The modified rework nozzle 102 is configured to supply a hot gas down on to the socket 104 to cause the solder to melt. A grip mechanism 106 and a grip mechanism 108 are attached to the modified rework nozzle 102. As further depicted in FIGS. 2-4 (which are described below), the grip mechanisms 106, 108 are positioned beneath the electrical component to be removed and above the PCB during a rework process. A sensor 110 is coupled to the grip mechanism 106 to detect a movement of the grip mechanism 106 that is in response to a movement of the electrical component apart from the PCB. Similarly, a sensor 112 is coupled to the grip mechanism 108 to detect a movement of the grip mechanism 108 that is in response to a movement of the electrical component apart from the PCB.

Figure 2:
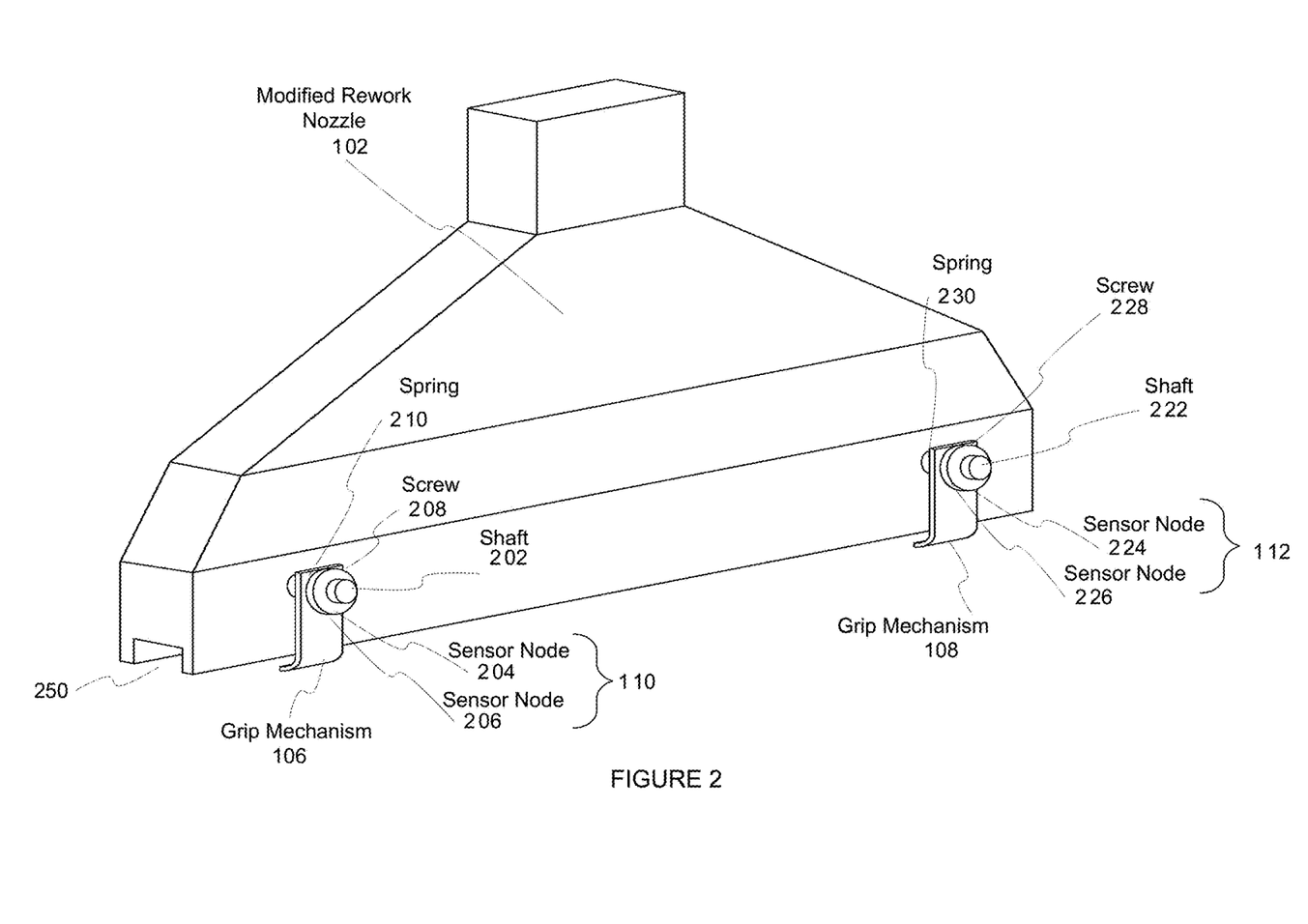
FIG. 2 depicts a more detailed view of a modified rework nozzle that includes sensor-based removal of a soldered component, according to some embodiments.

FIG. 2 depicts a more detailed view of a modified rework nozzle that includes sensor-based removal of a soldered component, according to some embodiments. FIG. 2 depicts a more detailed view of the modified rework nozzle 102 depicted in FIG. 1. The modified rework nozzle 102 includes a cutout 250 that can run along a length of the bottom of the nozzle 102 where the electrical component in the PCB can be positioned relative to the modified rework nozzle 102 in preparation of rework process to remove the electrical component from the PCB. The sensor 110 includes a sensor node 204 and a sensor node 206. The sensors can be any type of sensor. For example, the sensors can be any connection that closes/opens an electrical circuit (e.g., two conductors). The grip mechanism 106 is attached to a side of the nozzle 102 using a shaft 202 and a screw 208. Also, a spring 210 is within the shaft 202. The sensor 112 includes a sensor node 224 and a sensor node 226. The grip mechanism 108 is attached to a side of the modified rework nozzle 102 using a shaft 222 and a screw 228. Also, a spring 230 is within the shaft 222.

As further described below, as the solder that attaches the electrical component to the PCB melts during the rework process, the spring 210 also moves in response because the spring 210 is coupled to the grip mechanism 106 that is positioned beneath the electrical component and above the PCB. Similarly, the spring 230 moves in response because the spring 230 is coupled to the grip mechanism 108 that is positioned beneath the electrical component and above the PCB.

The sensor node 206 is coupled to the spring 210. Therefore, the sensor node 206 can detect movement of the spring 210 relative to the position of the sensor node 204. In particular, as the spring 210 moves, the sensor node 206 also moves. The movement of the sensor node 204 relative to the sensor node 206 can be detected. Once this movement of the spring 210 (and thus the sensor node 204) is beyond a threshold distance, the solder attaching the electrical component to the PCB is considered sufficiently melted to remove the electrical component from the PCB.

Similarly, the sensor node 226 is coupled to the spring 230. Therefore, the sensor node 226 can detect movement of the spring 230 relative to the position of the sensor node 224. In particular, as the spring 230 moves, the sensor node 226 also moves. The movement of the sensor node 226 relative to the sensor node 224 can be detected. Once this movement of the spring 230 (and thus the sensor node 226) is beyond a threshold, the solder attaching the electrical component to the PCB is considered sufficiently melted to remove the electrical component from the PCB.

The threshold of movement of the springs 210 and 230 can vary depending on the type of solder, type of PCB, type of electrical component, etc. In some embodiments, the threshold of movement can be as low as 0.003"-0.0005". For example, solder A can require a greater threshold of movement than solder B. In turn, once the threshold of movement is exceeded, the sensors 110-112 can notify the modified rework nozzle 102 or operator thereof that the electrical component can be safely removed or lifted from the PCB. For example, the sensors 110-112 can be communicatively coupled to a computer (wired or wirelessly). In response to receiving notification of movement of the springs from the one, some or all of the sensors, the computer can activate the modified rework nozzle 102 to lift the electrical component from the PCB. In some embodiments, the computer does not activate the modified rework nozzle 102 to lift the electrical component until movement of both the springs 110-112 exceed the threshold. Also, while the modified rework nozzle 102 is depicted as including only two grip mechanisms/springs/sensors combinations, in some embodiments the modified rework nozzle 102 can include any number of grip mechanisms/springs/sensors combinations. Also, in some embodiments the threshold to detect movement can vary depending on the position of the grip mechanism. For example, a grip mechanism positioned on an outer edge of the electrical component can have a greater threshold of movement than a grip mechanism positioned closer to a center of the electrical component.

Figure 3:
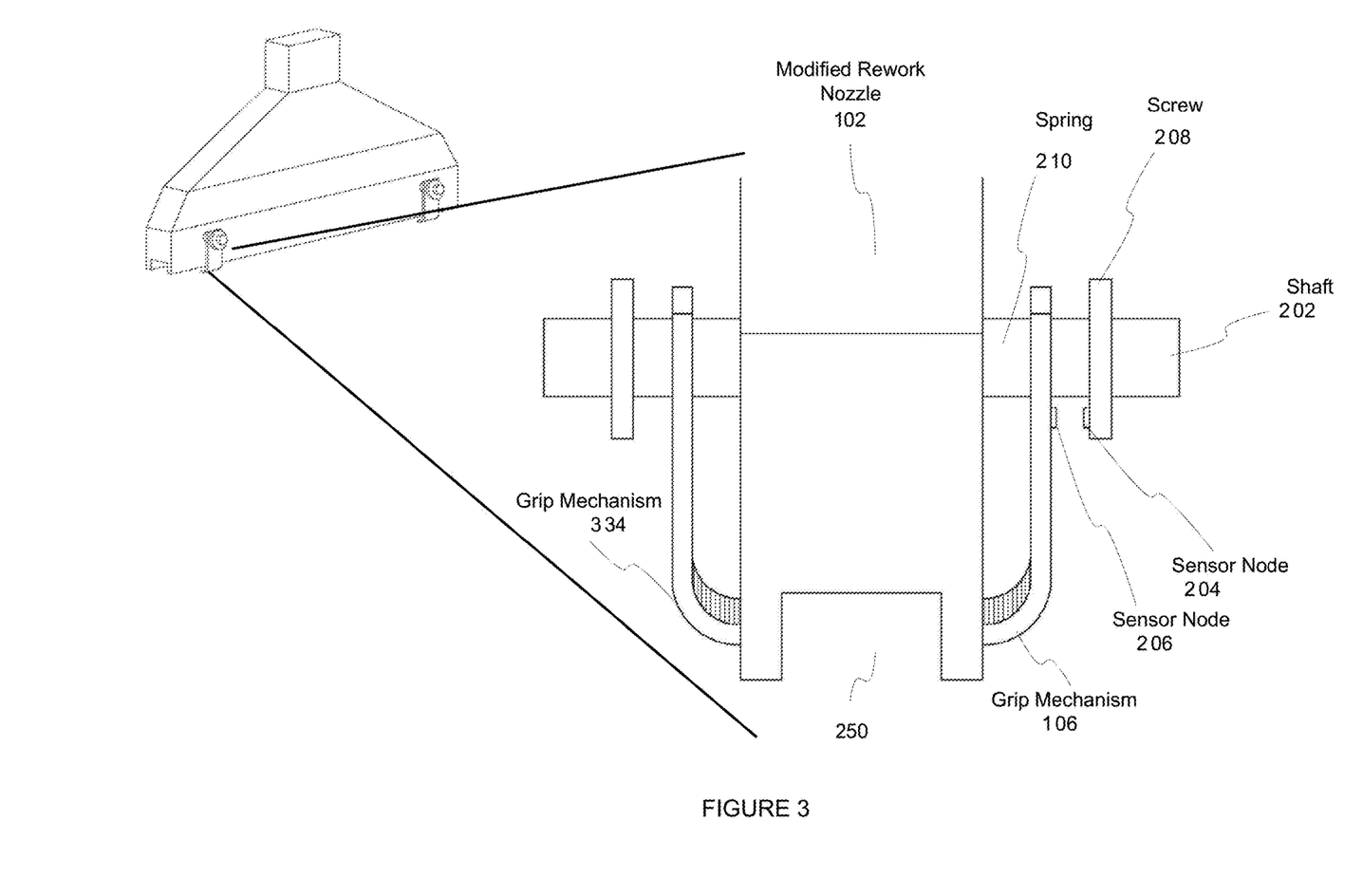
FIG. 3 depicts an alternative view of the sensors, spring and grip mechanism of the modified rework nozzle, according to some embodiments.

FIG. 3 depicts an alternate view of the sensors, spring and grip mechanism of the modified rework nozzle depicted in FIG. 2, according to some embodiments. In particular, FIG. 3 depicts a side view of one of the grip mechanisms that includes associated sensor nodes to detect spring movement. FIG. 3 includes the modified rework nozzle 102 that includes the cutout 250 that can run along a length of the bottom of the modified rework nozzle 102 where the electrical component in the PCB can be positioned relative to the modified rework nozzle 102 in preparation of rework process to remove the electrical component from the PCB. The grip mechanism 106 is coupled to the sensor node 206. The shaft 202 includes the spring 210. Also, the screw 208 positioned along the shaft 202 includes the sensor node 204. As described above, as the solder that attaches the electrical component to the PCB is melting during the rework process, the spring 210 also moves in response. In turn, the movement of the spring 210 causes the sensor node 206 to move relative to the sensor node 204. Once this relative movement of the sensors nodes 204-206 exceeds a threshold, a signal can be transmitted (wired or wirelessly) to a computer to provide notification that the solder has melted. In response to receiving notification of movement of the springs from the one, some or all of the sensors, the computer can activate the modified rework nozzle 102 to lift the electrical component from the PCB. In this example, FIG. 3 depicts a grip mechanism 334 that is opposite the grip mechanism 106. Similar to the grip mechanism 106, the grip mechanism 334 is positioned beneath the electrical component and above the PCB. In this example, the grip mechanism 334 does not include associated sensor nodes and spring to detect solder melting. In alternative embodiments, sensor nodes and spring can be included with the grip mechanism 334 (similar to the grip mechanism 106).

Figure 4:
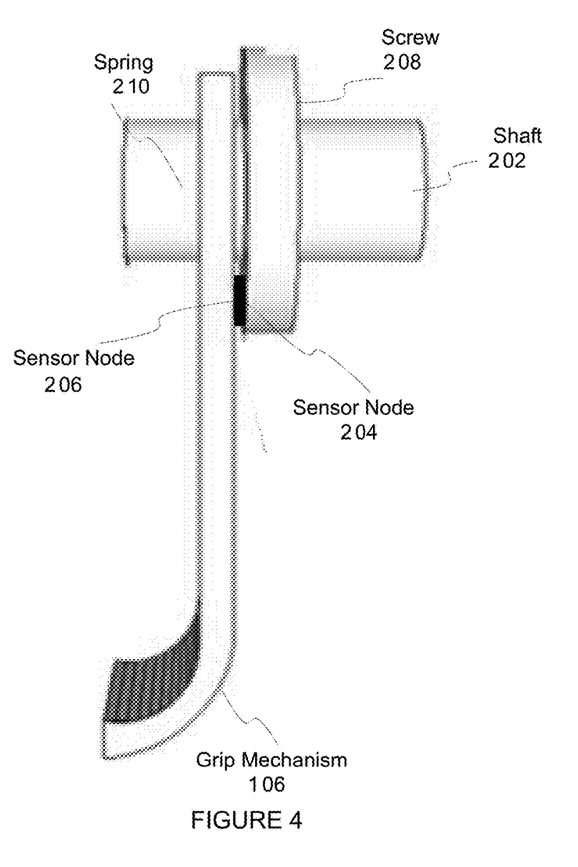
FIGS. 4-5 depict the sensors, spring and grip mechanism of the modified rework nozzle prior to and after spring movement, respectively, caused by the melting of solder, according to some embodiments.
Figure 5:
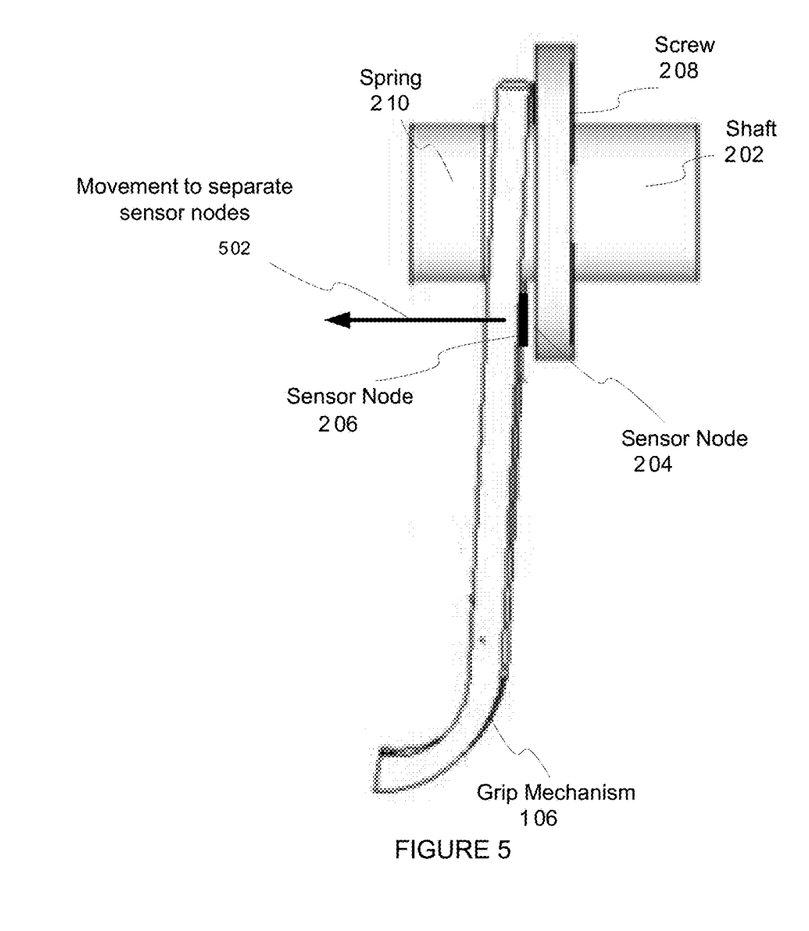

To better illustrate the spring movement in response to the melting of the solder, FIGS. 4-5 depict the sensors, spring and grip mechanism of the modified rework nozzle prior to and after spring movement, respectively, caused by the melting of solder, according to some embodiments. FIGS. 4-5 depict the grip mechanism 106 that is positioned along the shaft 202 that includes the spring 210. The sensor node 206 is positioned on the grip mechanism 106. The sensor node 204 is positioned on the screw 208. FIG. 4 depicts the grip mechanism 106, the spring 210, and the sensor nodes 204-206 prior to movement of the grip mechanism 106 that is to be caused by movement of the electrical component (not shown) which is a result of melting of the solder that is fixing the electrical component to the PCB. As shown in FIG. 4, the sensor node 206 is adjacent to the sensor node 204.

FIG. 5 depicts the grip mechanism 106, the spring 210, and the sensor nodes 204-206 after movement of the grip mechanism 106 that is caused by movement of the electrical component (not shown) which is a result of melting of the solder that is attaching the electrical component to the PCB. As shown, the grip mechanism 106 moves such that sensor node 206 and the sensor node 204 separate from each other (402). Specifically, the spring 210 moves in response to the movement of the grip mechanism 106, which is caused by the movement of the electrical component after the melting of the solder that attaches the electrical component to the PCB. The separation of the sensor nodes 204-206 can then trigger transmission of a signal to a computer to provide notification that the solder has melted. In response to receiving notification of movement of the springs from the one, some or all of the sensors, the computer can activate the modified rework nozzle 102 to lift the electrical component from the PCB.

FIGS. 2-5 depict the gripping mechanism and the spring as two separate entities. In some other embodiments, the gripping mechanism includes the spring. For example, the gripping mechanism can include a flat spring with an angled curve. The tightening of the screw can cause the gripping mechanism (spring) to be under tension. Therefore, as the solder melts the component under rework will move, resulting in the associated sensor nodes to disengage from each other.

Figure 6:
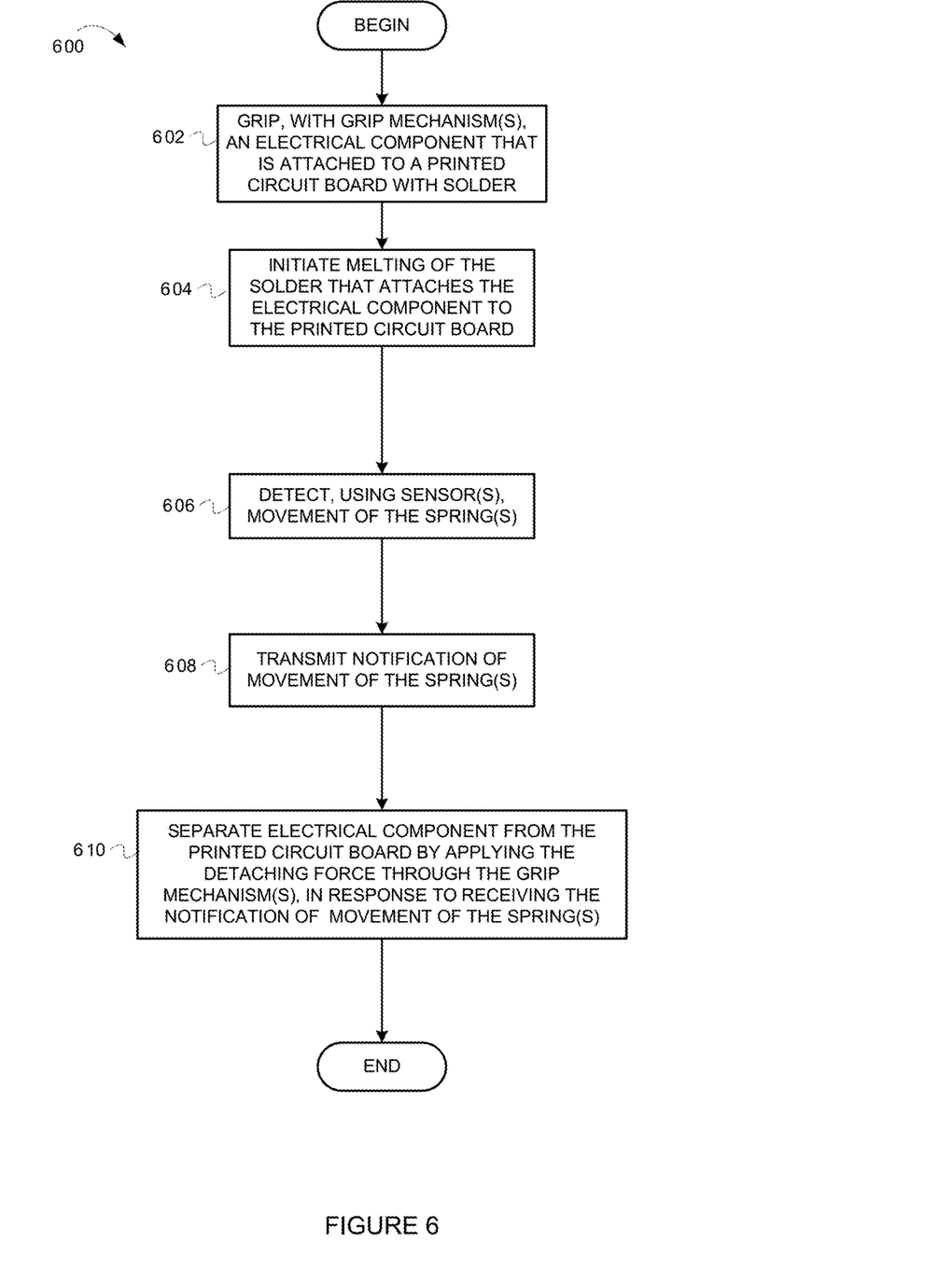
FIG. 6 depicts a flowchart for detaching a soldered component, connector, or socket from a circuit board using a modified rework nozzle of a rework tool that includes sensor-based removal of a soldered component, connector, or socket, according to some embodiments.

FIG. 6 depicts a flowchart for detaching a soldered component, connector, or socket from a circuit board using a modified rework nozzle of a rework tool that includes sensor-based removal of a soldered component, connector, or socket, according to some embodiments. FIG. 6 depicts a flowchart 600 that will be described in reference to FIGS. 1-5. Operations of the flowchart 600 start at block 602.

At block 602, a component, connector, or socket that is attached to a PCB with solder is gripped with grip mechanism(s) of a modified rework nozzle. With reference to FIGS. 1-2, the grip mechanisms 106-108 of the modified rework nozzle 102 are positioned below the component, connector, or socket of the PCB to grip the component, connector, or socket in preparation of removing the component, connector, or socket from the PCB. As described above, the grip mechanisms 106-108 include associated springs. Also, the grip mechanisms 106-108 can apply an initial force to the component, connector, or socket to enable the associated springs to move in response to the initiation of the solder melting. This initial force would be less than a detaching force. The detaching force can be defined as a force that would be needed to separate the component, connector, or socket from the PCB after the solder has at least partially melted. Operations of the flowchart 600 continue at block 604.

At block 604, melting of the solder that attaches the component, connector, or socket to the PCB is initiated. With reference to FIGS. 1-2, the modified rework nozzle 102 can supply a hot gas down on to a component, connector, or socket to cause the solder to melt. Operations of the flowchart 600 continue at block 606.

At block 606, movement of the spring(s) is detected using sensor(s). With reference to FIG. 2, as the solder that attaches the component, connector, or socket to the PCB is melting during the rework process, the spring 210 also moves in response because the spring 210 is coupled to the grip mechanism 106 that is positioned beneath the component, connector, or socket and above the PCB. Similarly, the spring 230 moves in response because the spring 230 is coupled to the grip mechanism 108 that is positioned beneath the component, connector, or socket and above the PCB.

The sensor node 204 is coupled to the spring 210. Therefore, the sensor node 204 can detect movement of the spring 210 relative to the position of the sensor node 206. In particular, as the spring 210 moves, the sensor node 204 also moves. The movement of the sensor node 204 relative to the sensor node 206 can be detected. Once this movement of the spring 210 (and thus the sensor node 204) is beyond a threshold, the solder attaching the component, connector, or socket to the PCB is considered sufficiently melted to remove the component, connector, or socket from the PCB. Similarly, the sensor node 224 is coupled to the spring 230. Therefore, the sensor node 224 can detect movement of the spring 230 relative to the position of the sensor node 226. In particular, as the spring 230 moves, the sensor node 224 also moves. The movement of the sensor node 224 relative to the sensor node 226 can be detected. Once this movement of the spring 230 (and thus the sensor node 224) is beyond a threshold, the solder attaching the component, connector, or socket to the PCB is considered sufficiently melted to remove the component, connector, or socket from the PCB. Returning to FIG. 6, operations of the flowchart 600 continue at block 608.

Figure 7:
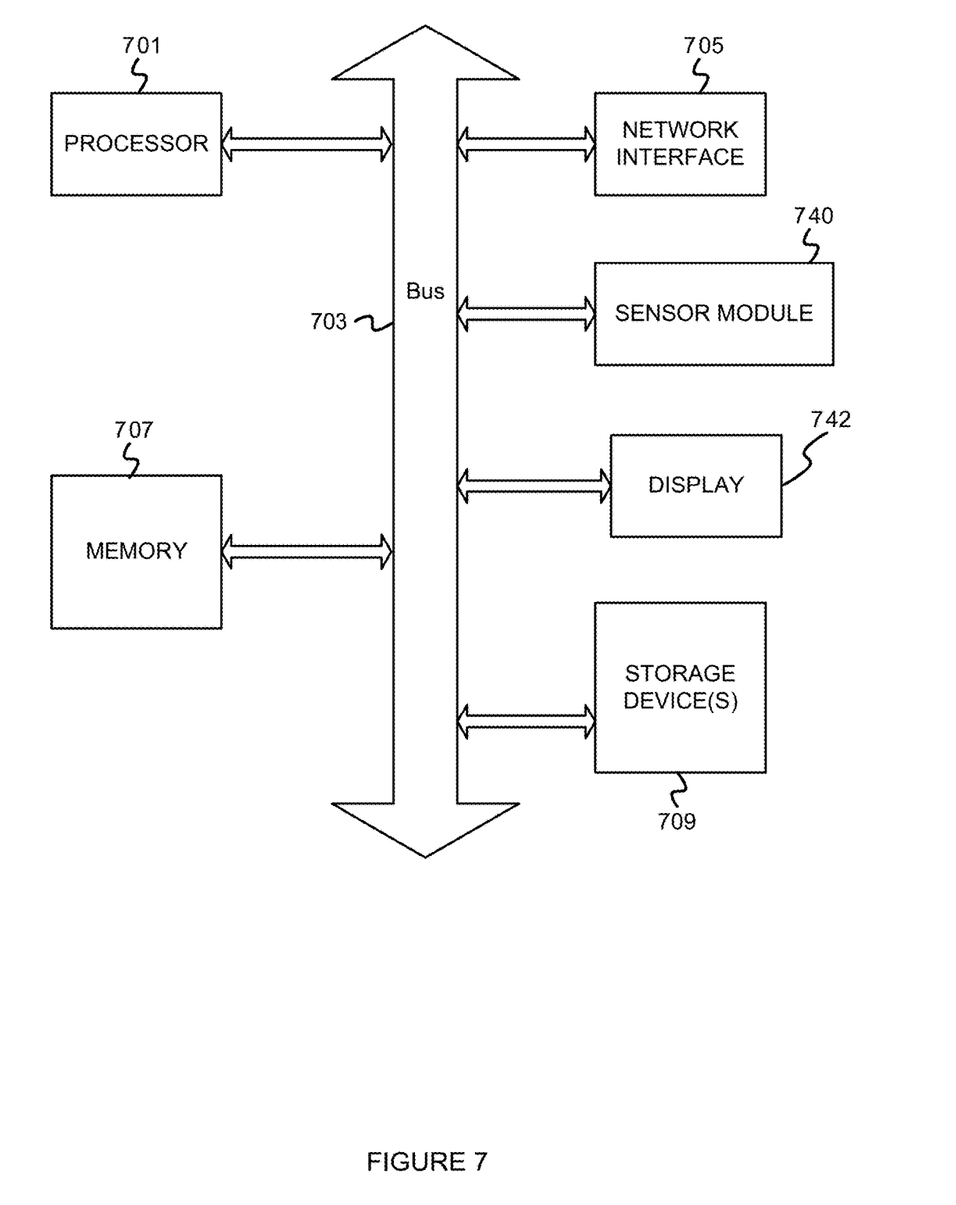
FIG. 7 depicts an example computer for controlling a modified rework nozzle that includes sensor-based removal of a soldered component, according to some embodiments.

At block 608, notification of movement of the spring(s) is transmitted. With reference to FIG. 2, the sensors 110-112 can be communicatively coupled to a computer (not shown). An example of a computer is depicted in FIG. 7, which is described in more detail below. The sensor 110 can transmit the notification of the movement of the spring 210 to the computer. The sensor 112 can transmit the notification of the movement of the spring 230 to the computer. Operations of the flowchart 600 continue at block 610.

At block 610, the component, connector, or socket is separated from the PCB by applying a detaching force through the grip mechanism(s). With reference to FIG. 1, in response to receiving notification of movement of the springs from the one, some or all of the sensors, the computer can activate the modified rework nozzle 102 to lift the component, connector, or socket from the PCB. In some embodiments, the computer does not activate the modified rework nozzle 102 to lift the component, connector, or socket until notifications are received from all of the sensor. In some other embodiments, the computer does not activate the modified rework nozzle 102 to lift the component, connector, or socket until notifications are received from a majority of the sensors. In some other embodiments, the computer activates the modified rework nozzle 102 to lift the component, connector, or socket notification is received from at least one sensor.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 7 depicts an example computer for controlling a modified rework nozzle that includes sensor-based removal of a soldered component, according to some embodiments. A computer includes a processor 701 (possibly including multiple processors, multiple cores, multiple nodes, and/or implementing multi-threading, etc.). The computer system includes a memory 707. The memory 707 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 703 (e.g., PCI, ISA, PCI-Express, HyperTransport®, InfiniBand®, NuBus, etc.), a network interface 705 (e.g., an ATM interface, an Ethernet interface, a Frame Relay interface, SONET interface, wireless interface, etc.), and a storage device(s) 709 (e.g., optical storage, magnetic storage, etc.). The computer system includes a display 742, which can be representative of a display to display the diagrams depicted in FIGS. 2-8 as described herein. The computer system also includes a sensor module 740 to receive signals from sensor(s) for controlling removal of an electrical component from a PCB, as described herein. Some or all of the operations of the sensor module 740 may be implemented with code embodied in the memory and/or processor, co-processors, other cards, etc. Any one of these operations may be partially (or entirely) implemented in hardware and/or on the processor 701. For example, the operations may be implemented with an application specific integrated circuit, in logic implemented in the processor 701, in a co-processor on a peripheral device or card, etc.

Further, realizations may include fewer or additional components not illustrated in FIG. 7 (e.g., video cards, audio cards, additional network interfaces, peripheral devices, etc.). The processor 701, the storage device(s) 709, the network interface 705, the memory 707, the sensor module 740, and the display 742 are coupled to the bus 703. Although illustrated as being coupled to the bus 703, the memory 707 may be coupled to the processor 701.

While the embodiments are described with reference to various implementations and exploitations, it will be understood that these embodiments are illustrative and that the scope of the inventive subject matter is not limited to them. In general, techniques for sensor-based removal of a soldered device as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. An apparatus comprising:
   at least one grip mechanism of a rework nozzle configured to grip an electrical component that is soldered to a printed circuit board;
   at least one spring coupled to the at least one grip mechanism, wherein the at least one spring is configured to move beyond a minimum threshold in response to an initiation of a melt of a solder that attaches the electrical component to the printed circuit board; and
   at least one sensor coupled to the at least one spring, wherein the at least one sensor is configured to detect the move of the at least one spring beyond the minimum threshold, and wherein the at least one sensor is configured to communicate at least one activate signal in response to detection of the move of the at least one spring beyond the minimum threshold.

2. The apparatus of claim 1, wherein the rework nozzle is configured to lift the electrical component from the printed circuit board using the at least one grip mechanism, in response to receipt of the at least one activate signal.

3. The apparatus of claim 1, further comprising:
   a module configured to generate heat to melt the solder that attaches the electrical component to the printed circuit board.

4. The apparatus of claim 1, wherein the at least one sensor comprises a first sensor node and a second sensor node, wherein the at least one sensor is configured to detect the move of the at least one spring in response to movement of the first sensor node relative to the second sensor node.

5. The apparatus of claim 1,
   wherein the at least one grip mechanism comprises,
      a first grip mechanism to grip the electrical component at a first location; and
      a second grip mechanism to grip the electrical component at a second location,
   wherein the at least one spring comprises,
      a first spring coupled to the first grip mechanism; and
      a second spring coupled to the second grip mechanism; and
   wherein the at least one sensor comprises,
      a first sensor coupled to the first spring, wherein the first sensor is configured to communicate a first activate signal of the at least one activate signal in response to detection of the move of the first spring beyond the minimum threshold; and
      a second sensor coupled to the second spring, wherein the second sensor is configured to communicate a second activate signal of the at least one activate signal in response to detection of the move of the second spring beyond the minimum threshold.

6. The apparatus of claim 5, wherein the rework nozzle is configured to lift the electrical component from the printed circuit board using the first grip mechanism and the second grip mechanism, in response to receipt of the first activate signal and the second activate signal.

7. The apparatus of claim 5, wherein the rework nozzle is configured to lift the electrical component from the printed circuit board using the first grip mechanism and the second grip mechanism, in response to receipt of at least one of the first activate signal and the second activate signal.

8. A method comprising:
   gripping, with at least one grip mechanism of a rework nozzle, an electrical component that is attached to a printed circuit board with solder, wherein the at least one grip mechanism is coupled to at least one spring and the gripping is to apply an initial force to the electrical component, wherein the initial force is less than a detaching force that is at least needed to separate the electrical component from the printed circuit board;
   initiating melting of the solder;
   detecting, using at least one sensor, a movement of the at least one spring beyond a minimum threshold; and
   transmitting at least one activate signal in response to detection of movement of the at least one spring beyond the minimum threshold.

9. The method of claim 8, further comprising:
   separating the electrical component from the printed circuit board by applying the detaching force through the at least one grip mechanism, in response to receiving the at least one activate signal.

10. The method of claim 8, further comprising:
    heating the solder that attaches the electrical component to the printed circuit board.

11. The method of claim 8,
    wherein the at least one sensor comprises a first sensor node and a second sensor node, and
    wherein detecting, using the at least one sensor, the movement of the at least one spring comprises detecting movement of the first sensor node relative to the second sensor node.

12. The method of claim 11, wherein detecting movement of the first sensor node relative to the second sensor node comprises detecting the first sensor node separating from the second sensor node.

13. The method of claim 8,
    wherein the at least one grip mechanism comprises,
       a first grip mechanism to grip the electrical component at a first location; and a second grip mechanism to grip the electrical component at a second location,
wherein the at least one spring comprises,
a first spring coupled to the first grip mechanism; and
a second spring coupled to the second grip mechanism;
wherein the at least one sensor comprises,
a first sensor coupled to the first spring, wherein the first sensor is configured to communicate a first activate signal of the at least one activate signal in response to detection of the movement of the first spring beyond the minimum threshold; and
a second sensor coupled to the second spring, wherein the second sensor is configured to communicate a second activate signal of the at least one activate signal in response to detection of the movement of the second spring beyond the minimum threshold.

14. The method of claim 13, further comprising:
separating the electrical component from the printed circuit board by applying the detaching force through the first grip mechanism and the second grip mechanism, in response to receiving the first activate signal and the second activate signal.

15. The method of claim 13, further comprising:
separating the electrical component from the printed circuit board by applying the detaching force through the first grip mechanism and the second grip mechanism, in response to receiving the first activate signal and the second activate signal.

16. A computer program product for removing an electrical component from a printed circuit board, the computer program product comprising:
a computer readable storage medium having computer usable program code embodied therewith, the computer usable program code comprising a computer usable program code configured to:
receive, from at least one sensor of a rework nozzle that is coupled to at least one spring, at least one activate signal in response to detection of movement of the at least one spring beyond a minimum threshold, wherein the at least one spring is coupled to at least one grip mechanism of the rework nozzle that is configured to grip the electrical component that is attached to a printed circuit board with solder, wherein the at least one spring is configured move beyond the minimum threshold after an initiation of a melt of the solder; and
transmit, in response to the at least one activate signal, a control signal to the rework nozzle, wherein the control signal is to cause the rework nozzle to lift the electrical component from the printed circuit board using the at least one grip mechanism.

17. The computer program product of claim 16, wherein the at least one sensor comprises a first sensor node and a second sensor node, wherein the computer usable program code is configured to receive the at least one activate signal in response to movement of the first sensor node relative to the second sensor node.

18. The computer program product of claim 17, wherein the movement of the first sensor node relative to the second sensor node comprises a separation of the first sensor node separating from the second sensor node.

19. The computer program product of claim 16,
wherein the at least one grip mechanism comprises,
a first grip mechanism to grip the electrical component at a first location; and
a second grip mechanism to grip the electrical component at a second location,
wherein the at least one spring comprises,
a first spring coupled to the first grip mechanism; and
a second spring coupled to the second grip mechanism;
wherein the at least one sensor comprises,
a first sensor coupled to the first spring, wherein the first sensor is configured to communicate a first activate signal of the at least one activate signal in response to detection of the move of the first spring beyond the minimum threshold; and
a second sensor coupled to the second spring, wherein the second sensor is configured to communicate a second activate signal of the at least one activate signal in response to detection of the move of the second spring beyond the minimum threshold,
wherein the computer usable program code is configured to receive the first activate signal and the second activate signal, and
wherein the computer usable program code is configure to the control signal to the rework nozzle, in response to receipt of the first activate signal and the second activate signal.

20. The computer program product of claim 16,
wherein the at least one grip mechanism comprises,
a first grip mechanism to grip the electrical component at a first location; and
a second grip mechanism to grip the electrical component at a second location,
wherein the at least one spring comprises,
a first spring coupled to the first grip mechanism; and
a second spring coupled to the second grip mechanism,
wherein the at least one sensor comprises,
a first sensor coupled to the first spring, wherein the first sensor is configured to communicate a first activate signal of the at least one activate signal in response to detection of the move of the first spring beyond the minimum threshold; and
a second sensor coupled to the second spring, wherein the second sensor is configured to communicate a second activate signal of the at least one activate signal in response to detection of the move of the second spring beyond the minimum threshold,
wherein the computer usable program code is configured to receive at least one of the first activate signal and the second activate signal, and
wherein the computer usable program code is configure to the control signal to the rework nozzle, in response to receipt of at least one of the first activate signal and the second activate signal.

* * * * *